United States Patent
Kim et al.

(10) Patent No.: US 9,437,537 B2
(45) Date of Patent: Sep. 6, 2016

(54) SEMICONDUCTOR DEVICE AND METHOD OF MANUFACTURING THE SAME

(75) Inventors: Hyun Sub Kim, Gyeonggi-do (KR); Sung Bo Shim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 732 days.

(21) Appl. No.: 13/571,524

(22) Filed: Aug. 10, 2012

(65) Prior Publication Data

US 2013/0270716 A1    Oct. 17, 2013

(30) Foreign Application Priority Data

Apr. 17, 2012  (KR) .................... 10-2012-0039712

(51) Int. Cl.
*H01L 21/48*  (2006.01)
*H01L 23/522* (2006.01)
*H01L 21/033* (2006.01)
*H01L 21/3213* (2006.01)

(52) U.S. Cl.
CPC ......... *H01L 23/522* (2013.01); *H01L 21/0337* (2013.01); *H01L 21/32139* (2013.01); *H01L 2924/0002* (2013.01)

(58) Field of Classification Search
CPC ... H01L 21/48; H01L 21/486; H01L 23/484; H01L 23/535
USPC .......................... 257/E27.098, 369
See application file for complete search history.

(56) References Cited

U.S. PATENT DOCUMENTS

| | | | |
|---|---|---|---|
| 2008/0142977 A1* | 6/2008 | Watanabe ............. | H01L 23/522 257/758 |
| 2009/0154240 A1* | 6/2009 | Park et al. ................ | 365/185.05 |
| 2010/0293515 A1* | 11/2010 | Inoue et al. .................... | 716/14 |
| 2011/0241126 A1* | 10/2011 | Herberholz ......... | H01L 29/0692 257/401 |
| 2013/0175589 A1* | 7/2013 | Chen ............................ | 257/296 |

* cited by examiner

*Primary Examiner* — Matthew Landau
*Assistant Examiner* — Krista Soderholm
(74) *Attorney, Agent, or Firm* — William Park & Associates Ltd.

(57) ABSTRACT

A semiconductor device including conductive lines configured to include first lines extending generally in parallel in a first direction and second lines extending generally in parallel in a second direction to intersect the first direction from the respective ends of the first lines and each second line having a width wider than the first line, and dummy patterns formed between the second lines.

13 Claims, 12 Drawing Sheets

SEMICONDUCTOR DEVICE AND METHOD OF MANUFACTURING THE SAME

CROSS-REFERENCE TO RELATED APPLICATION

The present application claims priority to Korean patent application number 10-2012-0039712 filed on Apr. 17, 2012, the entire disclosure of which is incorporated by reference herein in its entirety.

BACKGROUND

1. Technical Field

Embodiments of this disclosure relate to semiconductor devices and methods of manufacturing the same. Additionally, an embodiment of this disclosure relates to a semiconductor device including dummy patterns and a method of manufacturing the same.

A semiconductor device requires wires for coupling elements. That is, wires for coupling gate lines (for example, word lines) and a peripheral circuit (for example, a row decoder) are formed through a process.

2. Related Art

For example, the gate lines are formed in parallel in one direction and are coupled to the decoder through contact plugs and the wires at the ends of the gate lines. The width of the gate line is gradually narrowed in order to increase the degree of integration. In order to couple the gate lines and the contact plugs, contact pads are formed at respective parts where the gate lines and the contact plugs are coupled. As the contact pads are formed, a coupling margin between the gate lines and the contact plugs are improved, and an increase in resistance or the occurrence of failure, resulting from an alignment error, can be prevented.

However, process reappearance is deteriorated and production costs are increased because additional processes are necessary to form the contact pads. Furthermore, since the contact pad has a wider width than the gate line, an area occupied by elements in order to secure an interval between the contact pads is increased.

BRIEF SUMMARY

For example, an embodiment of this disclosure provides a semiconductor device and a method of manufacturing the same, which may be capable of reducing the area of a device, simplifying a manufacturing process, and improving reliability. In an embodiment of the present invention, a semiconductor device includes: conductive lines configured to include first lines extending generally in parallel in a first direction and second lines extending generally in parallel in a second direction to intersect the first direction from respective ends of the first lines and each second line having a width wider than the first line; and dummy patterns formed generally between the second lines.

In an embodiment of the present invention, a method of manufacturing a semiconductor device includes: forming a target etch layer, a first hard mask layer, and a second hard mask layer over a semiconductor substrate; forming generally L-shaped auxiliary patterns and dummy auxiliary patterns, placed between second lines in a second direction and each formed to have an opening at a center of the dummy auxiliary pattern, on the second hard mask layer, wherein a first line in a first direction is coupled to the second line in the second direction at the generally L-shaped auxiliary pattern; forming first spacers on sidewalls of the auxiliary patterns and the dummy auxiliary patterns and removing the auxiliary patterns and the dummy auxiliary patterns; forming second hard mask patterns by etching the second hard mask layer by a first etch process employing the first spacers as an etch mask; forming second spacers on sidewalls of the second hard mask patterns and removing the second hard mask patterns; forming first hard mask patterns by etching the first hard mask layer by a second etch process employing the second spacers as an etch mask; and forming generally L-shaped target patterns and dummy patterns placed between the target patterns in the second direction by etching the target etch layer by a third etch process employing the first hard mask patterns as an etch mask.

BRIEF DESCRIPTION OF THE DRAWINGS

FIGS. 2Ab to 2Jb are cross sectional views, taken at points A to A', of FIGS. 2A to 2J, respectively.

DESCRIPTION OF EMBODIMENTS

Hereinafter, various embodiments of the present disclosure will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 1:
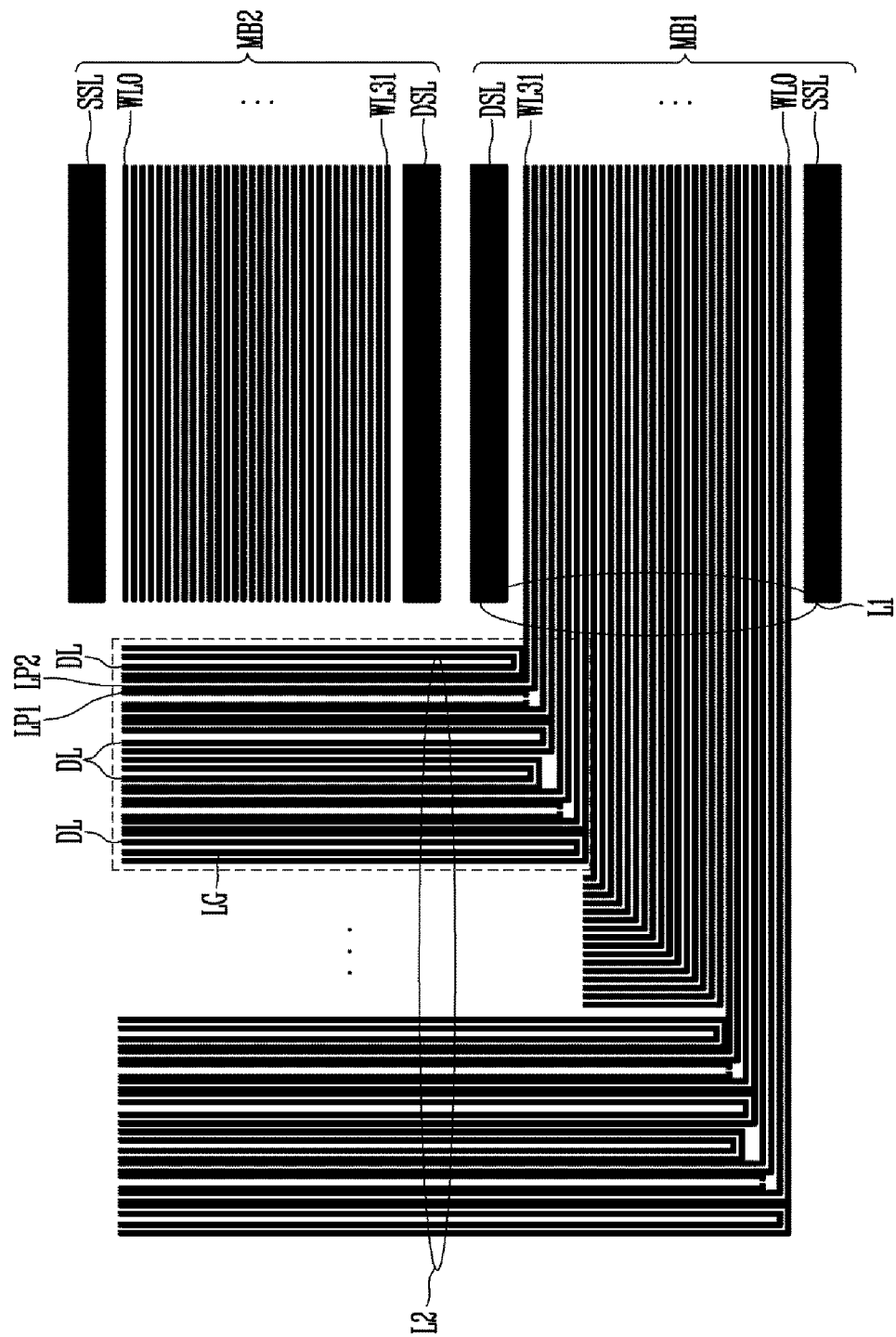
FIG. 1 is a plan view illustrating a semiconductor device according to an embodiment of the present invention.

FIG. 1 is a plane view illustrating a semiconductor device according to an embodiment of this invention.

Referring to FIG. 1, the semiconductor device according to the embodiment of this disclosure may include a plurality of memory blocks, memory block one MB1 and memory block 2 MB2. Each of the memory blocks MB1 and MB2 may include a plurality of conductive lines WL0 to WL31 which may be substantially bent into an L shape form, as shown in FIG. 1. The conductive lines WL0 to WL31 may become gate lines or word lines.

Each of the memory blocks MB1 and MB2 may further include conductive lines SSL and DSL formed on substantially the upper and lower sides of the plurality of conductive lines WL0 to WL31 and each may be formed to have a wider width than each of the lines WL0 to WL31. The conductive lines SSL and DSL may become a source select lines and drain select lines, respectively.

Each of the conductive lines WL0 to WL31 may include a first line L1 extended in a first direction and a second line L2 extended from the end of the first line L1 in a second direction to substantially cross the first direction and may be formed to have a wider width than the first line L1. The conductive lines WL0 to WL31 of the memory block MB1 and the conductive lines WL0 to WL31 of the memory block MB2 may be rotated by 180 degrees and arranged so that they substantially overlap with each other in order to improve the degree of integration.

Meanwhile, dummy patterns DL may be formed between the conductive lines WL0 to WL31 in the second direction. This is also described in detail below.

The conductive lines WL0 to WL31 may include the first lines L1 extended in parallel in the first direction and the second lines L2 extended from the respective ends of the first lines L1 in parallel in the second direction to substantially cross the first direction.

In order for the second lines L2 to substantially extended in parallel in the second direction, the first lines L1 may have to have different lengths. That is, the ends of the first lines L1 on one side may be aligned on the same line, and the ends of the first lines L1 on the other side, coupled to the second lines L2, may be diagonally aligned. It is preferred that the ends of the second lines L2 also be aligned on substantially the same line. Thus, the second lines L2 may have different lengths. As a result, the substantially L-shaped conductive lines WL0 to WL31 may be gradually increased in length and arranged so that they substantially surround adjacent short conductive lines.

The width of each of the second lines L2 may be wider than that of the first line L1 and may be about twice the width of the first line L1. Additionally, the second lines L2 may include first patterns LP1 extended in the second direction from the ends of the first lines L1 and second patterns LP2 formed substantially on the sidewalls of the first patterns LP1 on one side or the other side. The first pattern LP1 and the second pattern LP2 each may have the same width as the first line L1. Accordingly, the width of the second line L2 including the first and the second patterns LP1 and LP2 may be twice the width of the first line L1.

The dummy patterns DL may be disposed substantially between the second lines L2 and may be extended in the second direction. Also, the dummy patterns DL may not just be disposed between the second lines L2, but may be irregularly disposed between some of the second lines L2 according to an example of a manufacturing method. For example, the dummy patterns DL may be disposed on one side and the other side of a line group LG including four of the second lines L2. That is, the dummy patterns DL may not be disposed between the second lines L2 within the line group LG. Therefore, the dummy patterns DL may be disposed outside or on each side of the line group, before the first outer line of the line group and after a last outer line of the line group. The second pattern LP2 may be a part of the dummy pattern DL, but the sidewall of the second pattern LP2 may come in contact with the sidewall of the second line L2, thus becoming a part of the conductive line.

The first lines L1 may be arranged at substantially the same intervals and the second lines L2 may be arranged at irregular intervals depending on the arrangement of the dummy patterns DL. That is, an interval between the second lines L2 may be substantially identical to an interval between the first lines L1, and an interval between the second lines L2 in areas where the dummy patterns DL are disposed are wider than an interval between the first lines L1.

The second lines L2 of the conductive lines WL0 to WL31 may be formed to have a wider width than the first lines L1 as described above, and a contact plug may be formed on the second lines L2 having a wider width without forming contact pads on the second lines L2.

Figure 3:
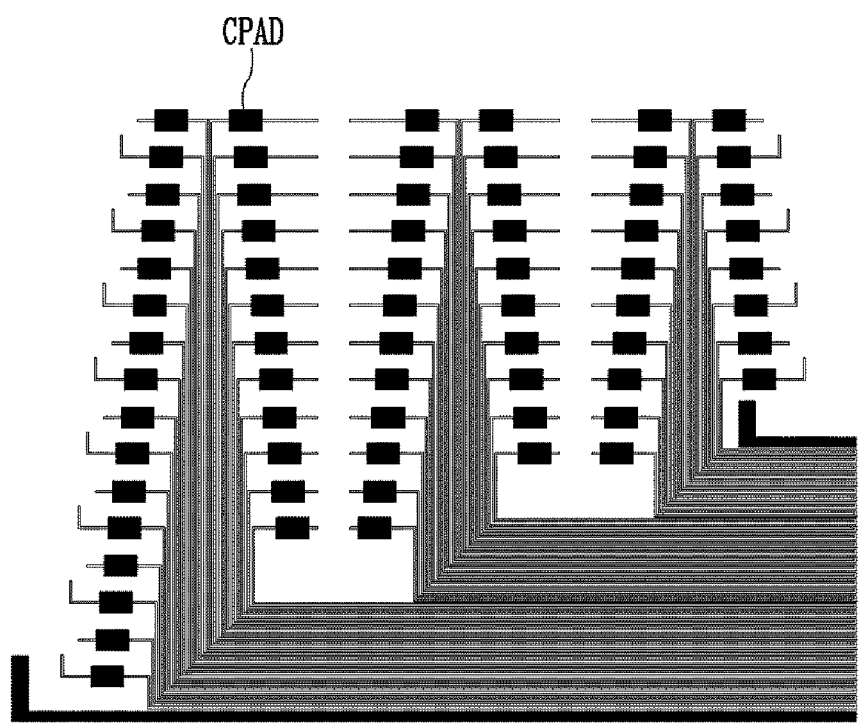
FIG. 3 is a diagram illustrating another example of a semiconductor device compared with the semiconductor device of FIG. 1.

FIG. 3 is a diagram illustrating another example of a semiconductor device compared to the semiconductor device of FIG. 1.

Referring to FIG. 3, when contact pads CPAD are formed, an overall area may be increased and the number of process steps for forming the contact pads CPAD may be increased in order to maintain an interval between the contact pads CPAD. Furthermore, since patterns may not be formed in some areas, pattern density may become irregular. Consequently, process characteristics may deteriorate and there may be a high possibility that failure may occur.

However, when the pattern density becomes substantially regular by forming the dummy pattern DL substantially between the second lines L2 as shown in FIG. 1, the occurrence of failure may be prevented because a manufacturing process may be uniformly applied to substantially all areas. Furthermore, since the second lines L2 of the conductive lines WL0 to WL31 to be coupled with a contact plug may be formed more widely, the contact plug may be formed on the second lines L2 without contact pads. Accordingly, a manufacturing process may be simplified because a process of forming the contact pads may be obviated. Furthermore, process reappearance may be secured, and reliability due to reduced failure may be improved.

An example of a method of manufacturing the semiconductor device is described below.

FIGS. 2A to 2J and 2Ab to 2Jb are diagrams illustrating the method of manufacturing the semiconductor device according to an embodiment of this invention.

Figure 2A:
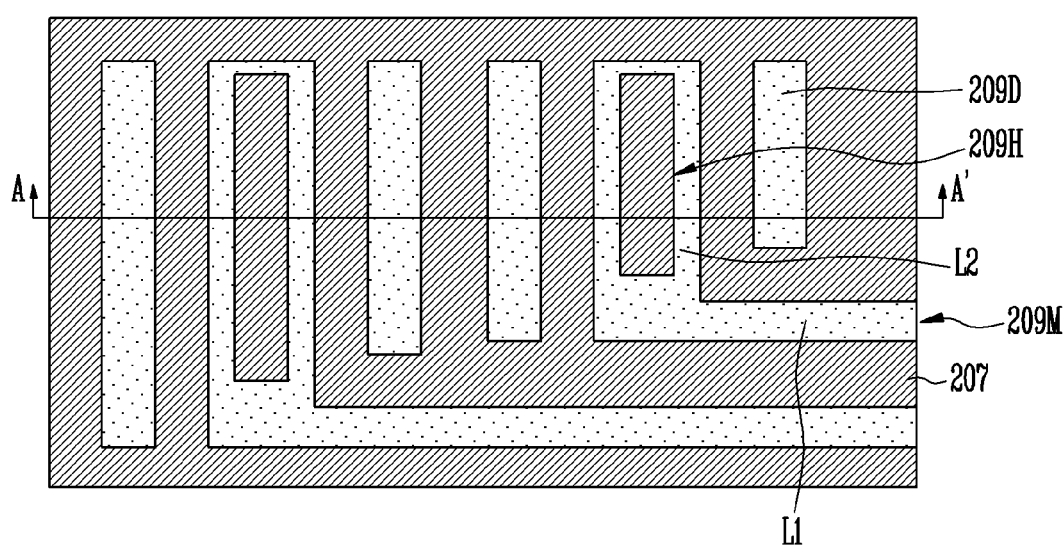
FIGS. 2A to 2J are diagrams illustrating a method of manufacturing the semiconductor device according to an example of an embodiment of the present invention.
Figure 2A:
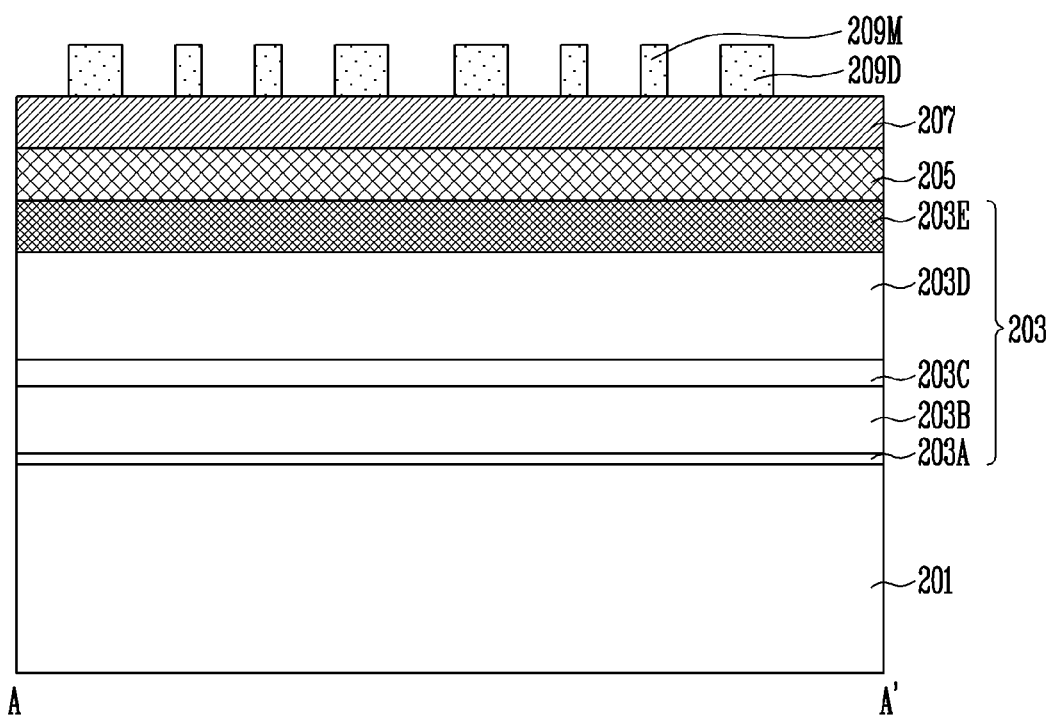

Referring to FIGS. 2A and 2Ab, a target etch layer 203, a first hard mask layer 205, and a second hard mask layer 207 may be formed over a semiconductor substrate 201. In the case of a flash device, the target etch layer 203 may include a tunnel insulating layer 203A, a first silicon layer 203B, a dielectric layer 203C, a second silicon layer 203D, and a third hard mask layer 203E.

The first and the second hard mask layers 205 and 207, respectively, preferably are made of different materials so that they are not substantially etched by the same etchant. Likewise, the first and the third hard mask layers 205 and 203E, respectively, preferably are made of different materials so that they are not substantially etched by the same etchant. The second and the third hard mask layers 207 and 203E, respectively, may be made of the same material.

Auxiliary patterns 209M and dummy auxiliary patterns 209D may be formed on the second hard mask layer 207. Each of the auxiliary patterns 209M may include a first line L1 extended in a first direction and a second line L2 extended in a second direction forming substantially an L shape form. An opening 209H may be formed at the center of the second line L2 and may be formed in a line form in the second direction.

The dummy auxiliary patterns 209D may be formed substantially between the second lines L2 of the auxiliary patterns 209M. Two dummy auxiliary patterns 209D may be regularly formed between the second lines L2 in parallel or substantially in parallel, but they may have different lengths.

Figure 2B:
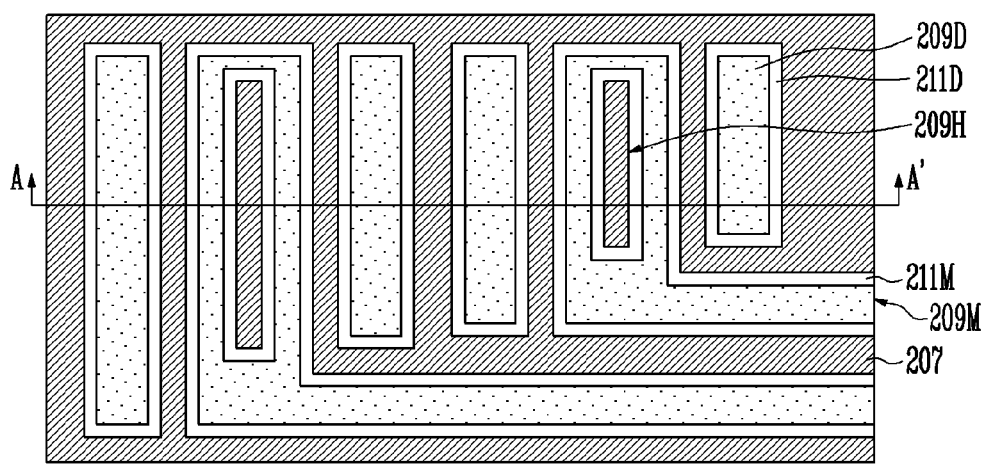
Figure 2B:
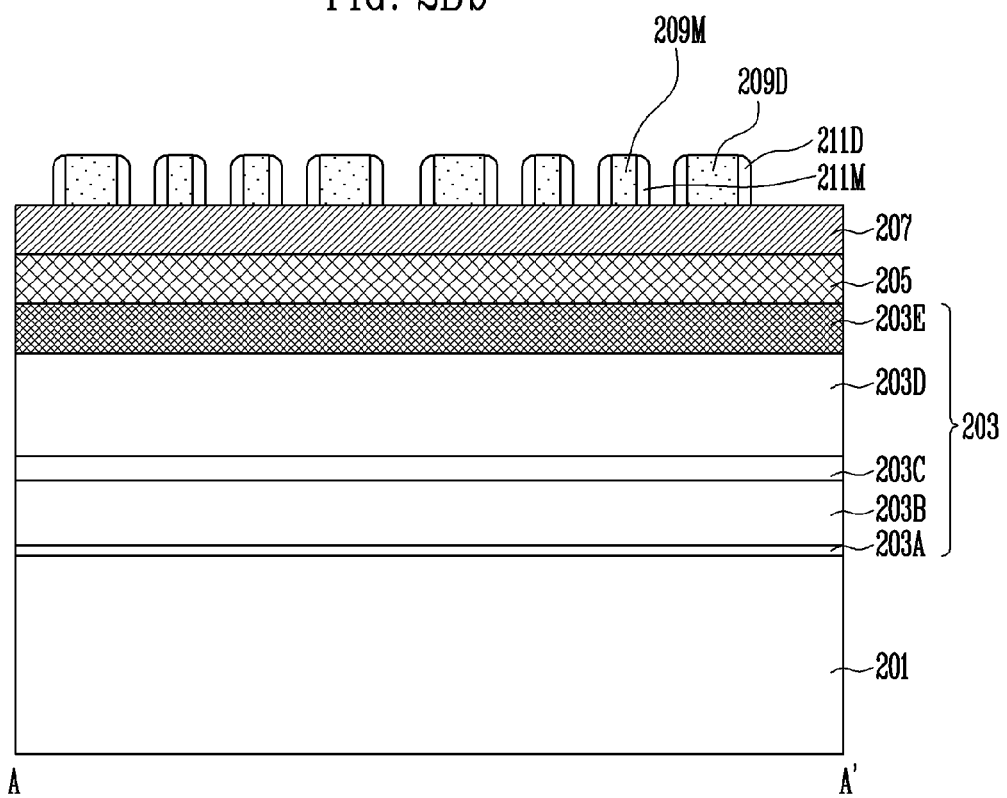

Referring now to FIGS. 2B and 2Bb, first spacers 211M may be formed on the sidewalls of the auxiliary patterns 209M and the dummy auxiliary patterns 209D. Additionally, after forming an insulating layer substantially over the entire surface, a blanket etch process may be performed so that the insulating layer remains only on the sidewalls of the auxiliary patterns 209M and the dummy auxiliary patterns 209D. It may be preferred that the insulating layer be made of a different material from the first hard mask layer 205 or the second hard mask layer 207 so that the insulating layer, together with the first hard mask layer 205 or the second hard mask layer 207, is not substantially etched by the same etchant. The first spacers 211M are formed not only on the outer sidewalls of the auxiliary patterns 209M, but may also be formed on the inner sidewalls of the openings 209H.

The thickness of the first spacer 211M may determine a final shape (or an interval) of the target patterns (for example, conductive lines) or the shape (or an interval) of the dummy patterns. Thus, the thickness of the first spacer 211M may preferably be controlled by taking the shape of the target patterns and the dummy patterns into consideration.

The first spacers 211M may be divided into first main spacers 211M formed on the sidewalls of the auxiliary patterns 209M and first dummy spacers 211D formed on the sidewalls of the dummy auxiliary patterns 209D.

Figure 2C:
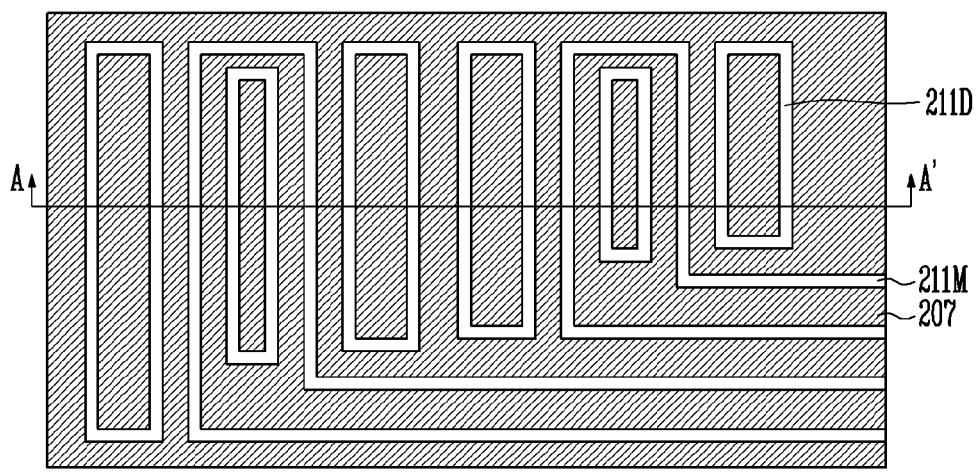
Figure 2C:
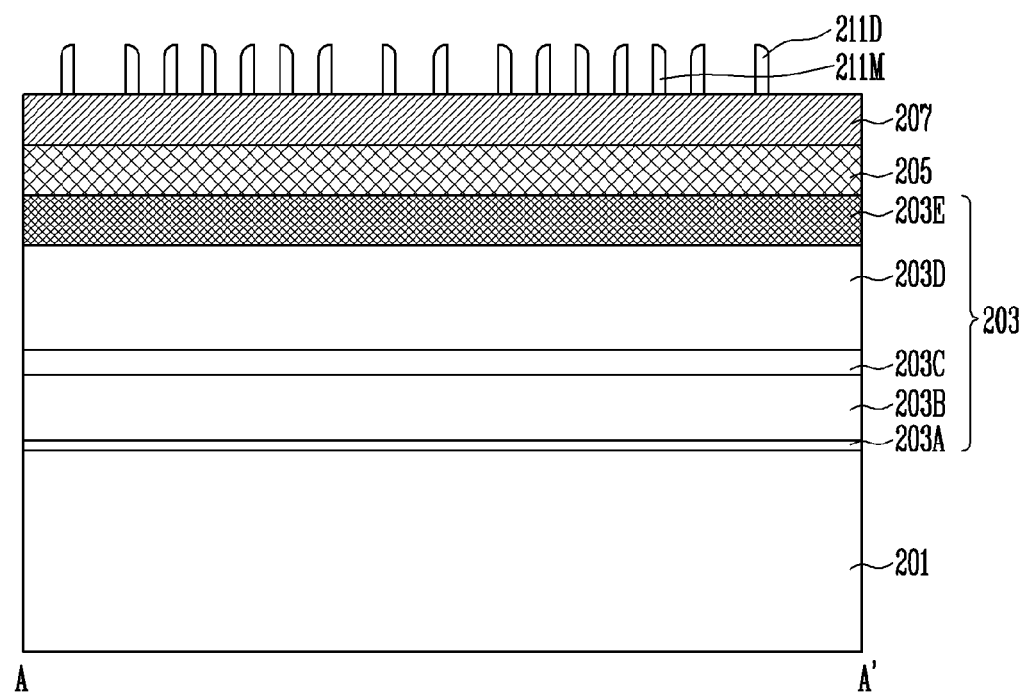

Referring to FIGS. 2C and 2Cb, the auxiliary patterns 209M and the dummy auxiliary patterns 209D of FIGS. 2A and 2Ab are removed. At this time, the first main spacers 211M and the second hard mask layer 207 remain substantially intact without being substantially etched because they may be made of different materials from the auxiliary patterns 209M and the dummy auxiliary patterns 209D.

Figure 2D:
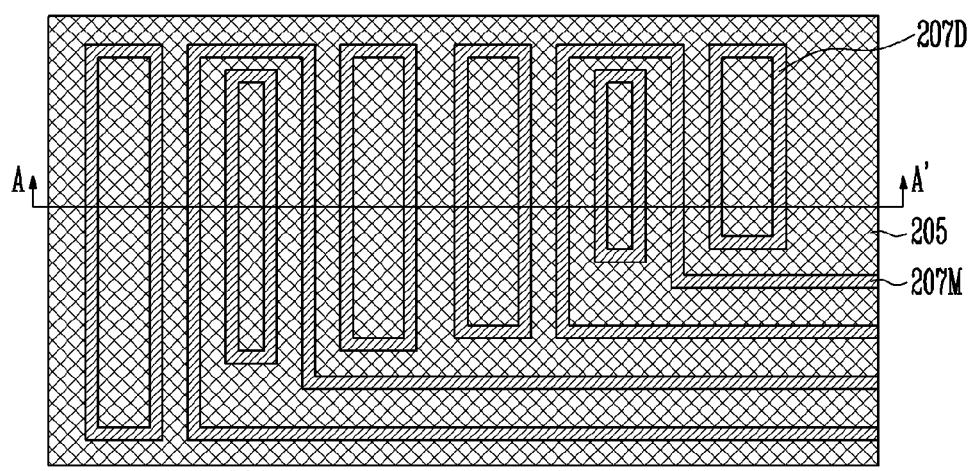
Figure 2D:
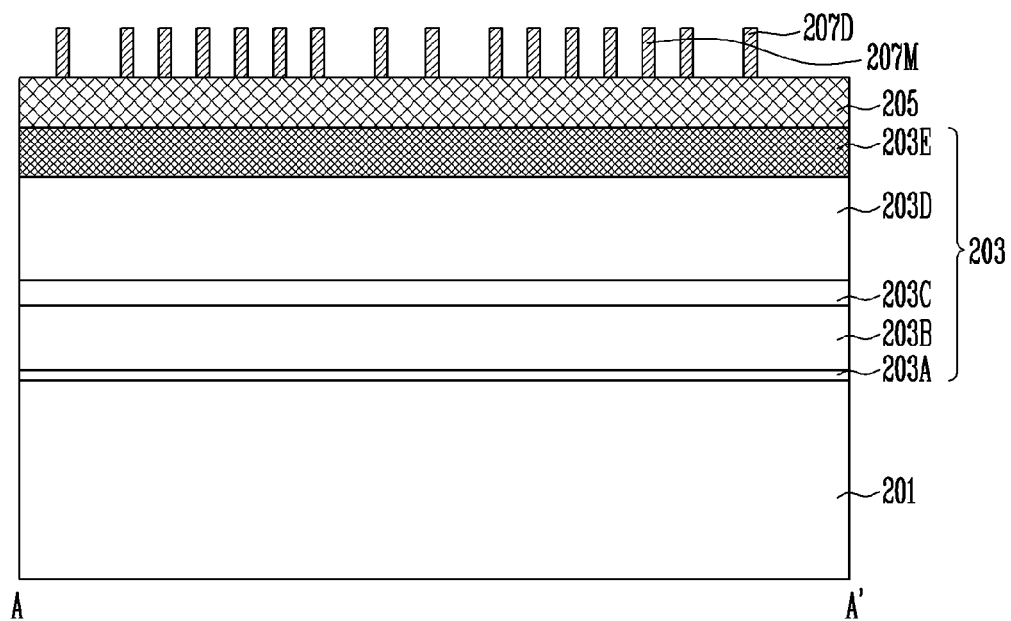

Referring to FIGS. 2D and 2Db, second hard mask patterns (207PM, 207PD) may be formed by etching the second hard mask layer 207 by a first etch process employing the first spacers 211M as an etch mask. The second hard mask patterns (207PM, 207PD) have substantially the same shape as the first spacers 211M and may include second main hard mask patterns 207M and second dummy hard mask patterns 207D. The second main hard mask pattern 207M may have substantially the same shape as the first main spacer, and the second dummy hard mask pattern 207D may have substantially the same shape as the first dummy spacer.

Meanwhile, if contact pads are formed in a subsequent process, a process of forming mask pads may be performed prior to the first etch process for forming the second hard mask patterns (207PM, 207PD) in order to substantially secure an interval substantially between the contact pads. In this example, however, the process of forming the mask pads may be omitted because the contact pads are not formed.

Figure 2E:
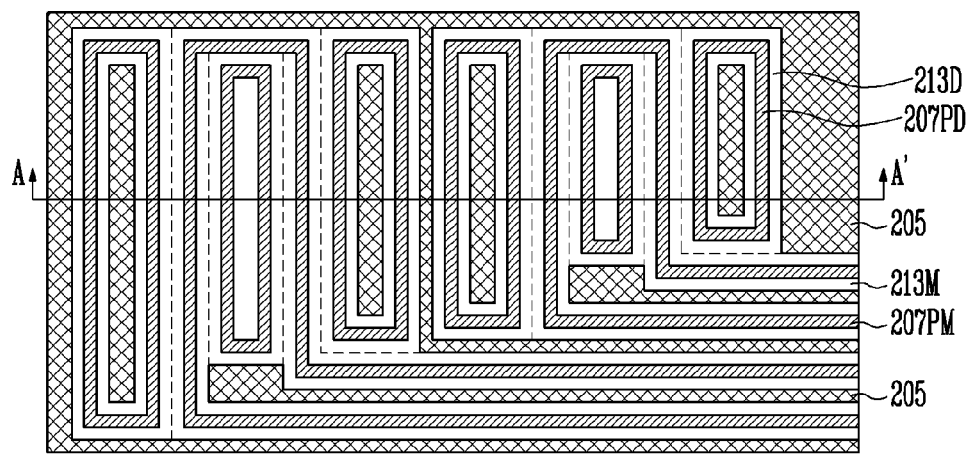
Figure 2E:
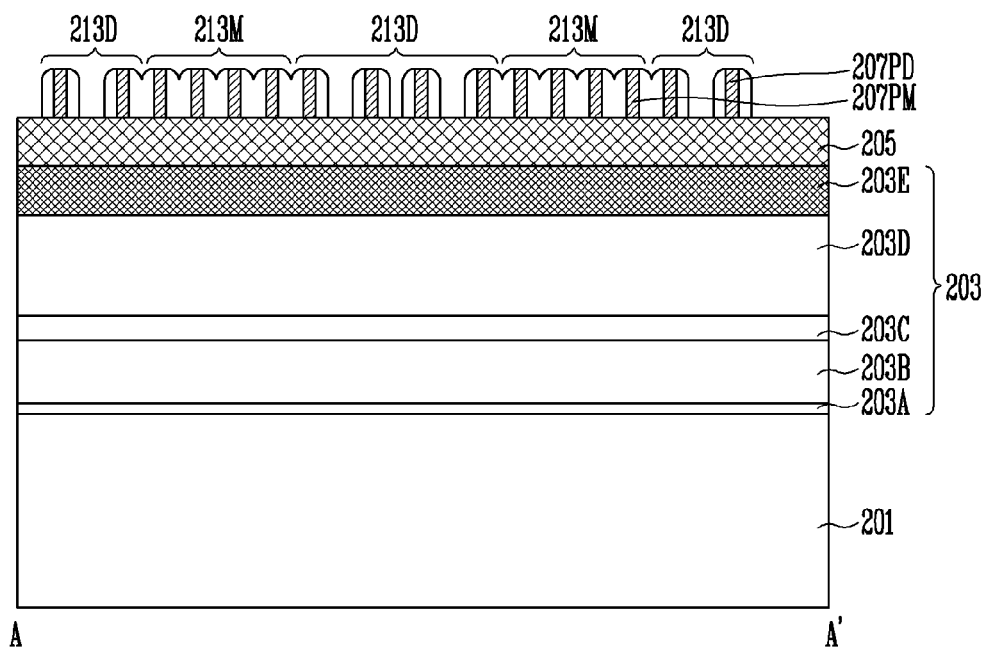

Referring to FIGS. 2E and 2Eb, second spacers (213M, 213D) may be formed on the sidewalls of the second hard mask patterns (207PM, 207PD). The second spacers (213M, 213D) may include second main spacers 213M formed on the sidewalls of the second main hard mask patterns 207PM and second dummy spacers 213D formed on the sidewalls of the second dummy hard mask patterns 207PD.

The sidewall of the second main spacer 213M may extend in the second direction coming in contact with the sidewall of the second dummy spacer 213D adjacent to the second main spacer 213M. To this end, it may be preferred that the shape and interval of the auxiliary patterns 209M, the dummy auxiliary patterns 209D, and the first spacers 211M be controlled as in the previous process described above.

Figure 2F:
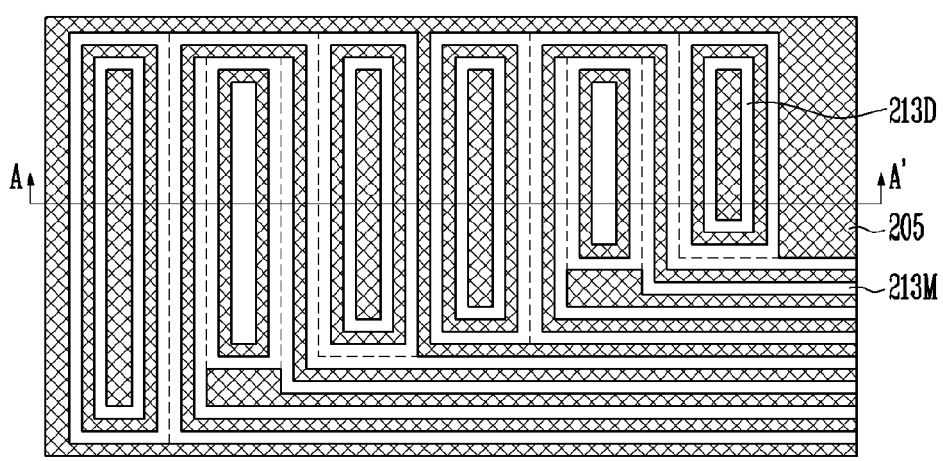
Figure 2F:
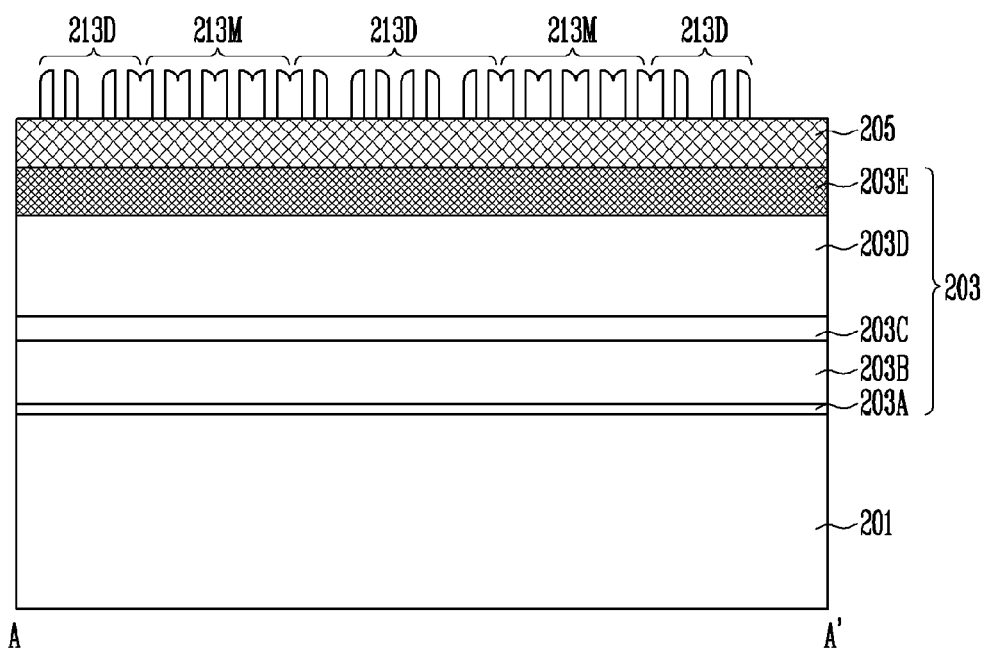

Referring to FIGS. 2F and 2Fb, the second hard mask patterns (207PM, 207PD of FIGS. 2E and 2Eb) may be removed, leaving the second spacers (213M, 213D) remaining substantially on the first hard mask layer 205.

Figure 2G:
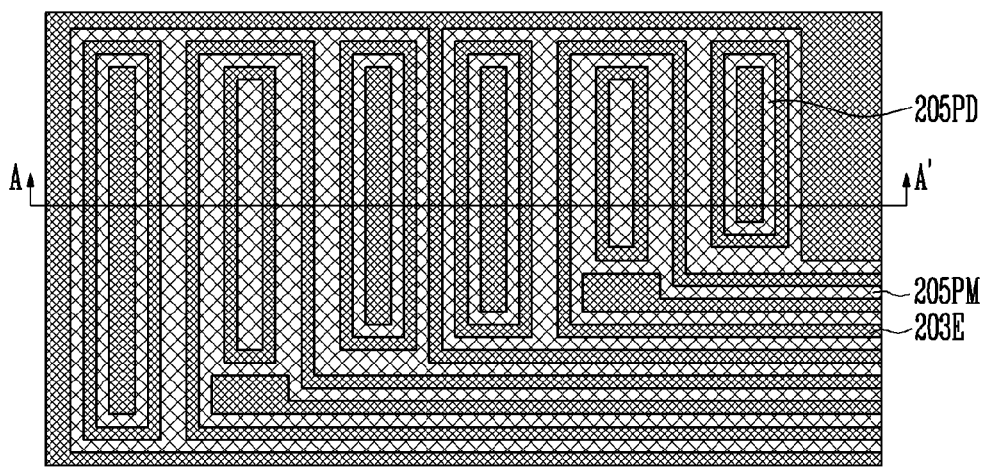
Figure 2G:
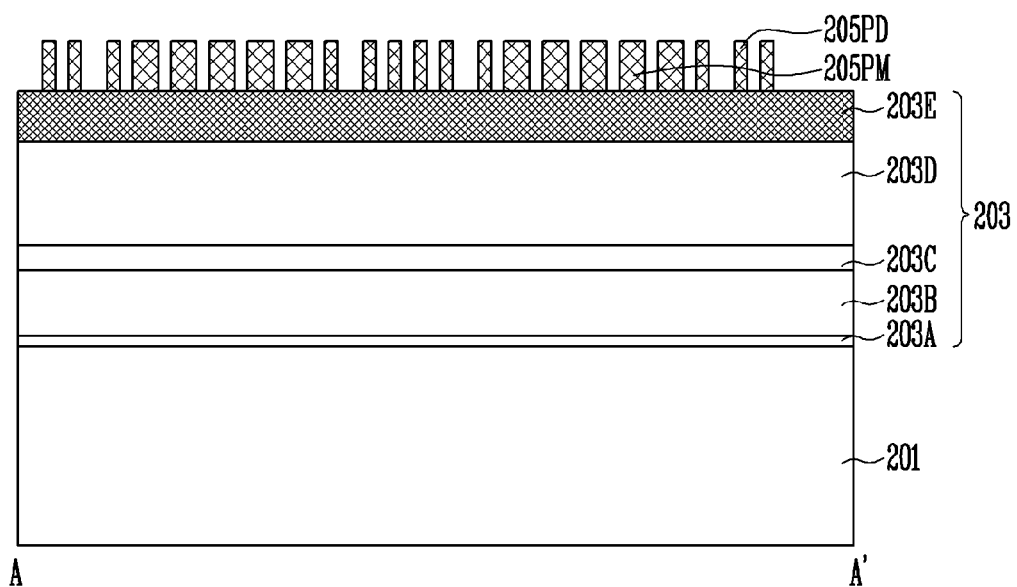

Referring to FIGS. 2G and 2Gb, the first hard mask patterns (205PM, 205PD) may be formed by etching the first hard mask layer 205 (see FIG. 2Fb) by a second etch process employing the second spacers (213M, 213D) (see FIGS. 2F and 2Fb) as an etch mask. The first hard mask patterns (205PM, 205PD) may include first main hard mask patterns 205PM having substantially the same shape as the second main spacers 213M and first dummy hard mask patterns 205PD having substantially the same shape as the second dummy spacers 213D.

Figure 2H:
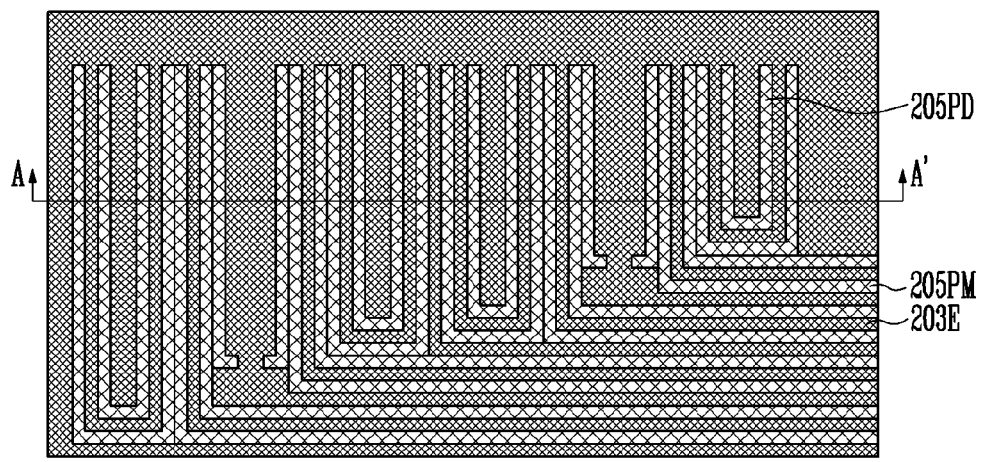
Figure 2H:
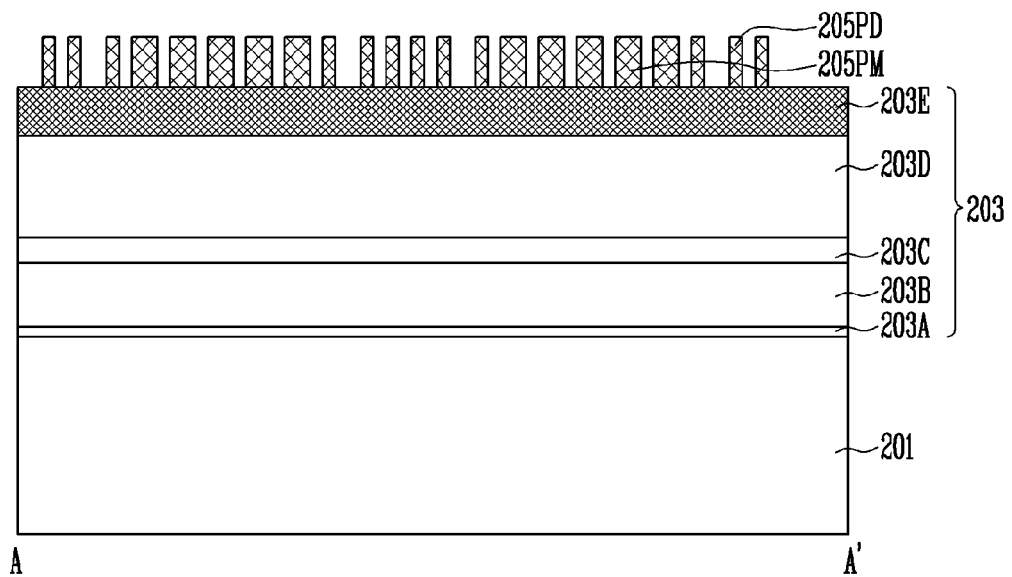

Referring to FIGS. 2H and 2Hb, a third etch process for removing parts coupled in the first direction, at the ends of the first hard mask patterns (205PM, 205PD) extended in the second direction, may be performed. Accordingly, each of the first main hard mask patterns 205PM may be disconnected, and each of the first dummy hard mask patterns 205PD may remain, substantially, in a U shape.

Meanwhile, if contact pads are formed in areas where contact plugs will be formed in a subsequent process, a process of forming the contact pads may then be performed. In this disclosure, however, the process of the contact pads may be omitted because the contact pads are not formed.

Figure 2I:
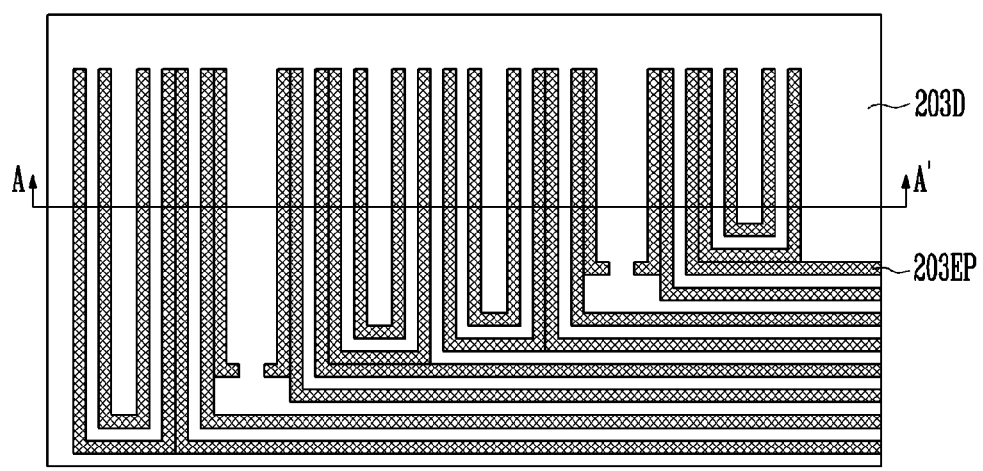
Figure 2I:
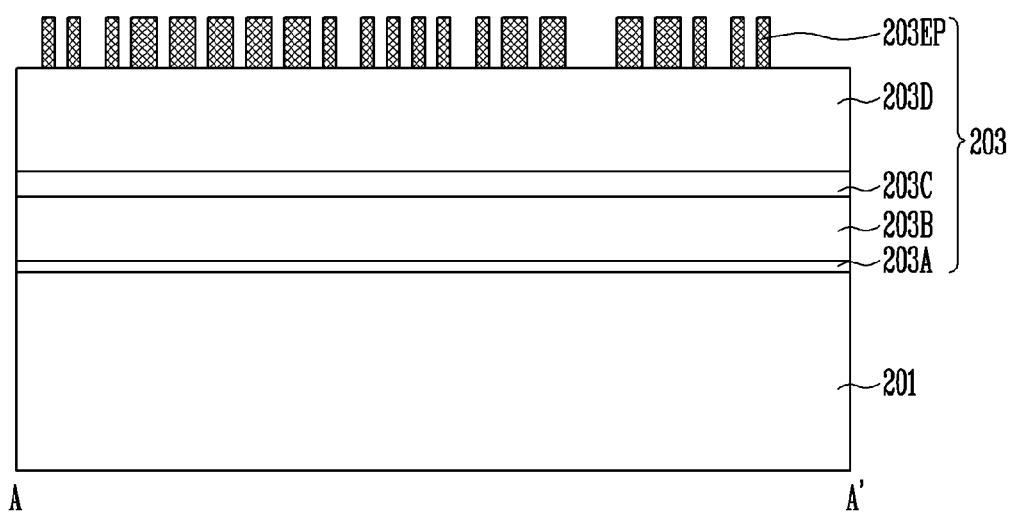

Referring to FIGS. 2I and 2Ib, the third hard mask patterns 203EP may be formed by performing a fourth etch process employing the first hard mask patterns (205PM, 205PD) (of FIGS. 2H and 2Hb) as an etch mask.

Figure 2J:
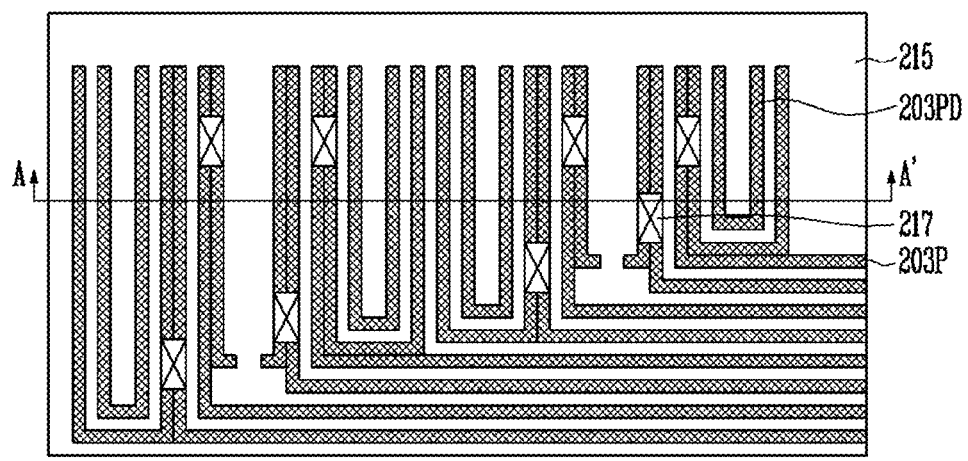
Figure 2J:
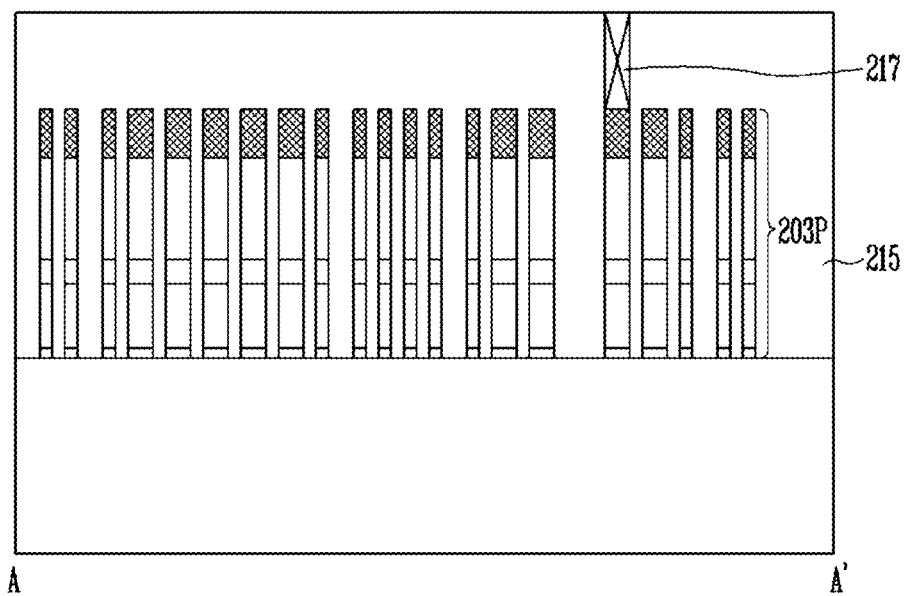

Referring to FIGS. 2J and 2Jb, the remaining layers 203A to 203D (see FIGS. 2I and 2Ib) of the target etch layers may be removed by a fifth etch process employing the third hard mask patterns of 203EP (see FIGS. 2I and 2Ib) as an etch mask. Accordingly, substantially L-shaped target patterns 203P and dummy patterns 203PD placed substantially between and the target patterns 203P in the second direction may be formed in the form of the conductive lines and the dummy patterns described with reference to FIG. 1. That is, the target patterns 203P become the conductive lines.

An interlayer insulating layer 215 may be formed over the entire surface, and a contact plug 217 may be formed substantially on the target patterns 203P.

Since the target pattern 203P in the second direction has a relatively wide width, the contact plug 217 may be easily aligned substantially on the target pattern 203P even without forming contact pads. Furthermore, pattern density may become regular in most areas adjacent the several dummy patterns 205PD, 207PD, 209D, 211D, and 213D in each of the etch processes. Accordingly, the etch process may be prevented from being excessively performed in a specific area. Thus, due to the process described above, process characteristics may be improved.

In accordance with this disclosure, the area can be reduced, and the process can be simplified. Accordingly, process reappearance can be secured, and improved reliability resulting from reduced failure can be achieved.

What is claimed is:

1. A semiconductor device, comprising:
   conductive lines configured to include first lines extending generally in parallel in a first direction and second lines extending generally in parallel in a second direction to intersect the first direction from respective ends of the first lines;
   dummy patterns formed generally between the second lines; and
   a contact plug wherein each second line has a width wider than the first line, such that the contact plug is aligned on one of the second lines.

2. The semiconductor device of claim 1, wherein the width of the second line is at least twice the width of the first line.

3. The semiconductor device of claim 1, wherein the second lines comprise first patterns extended in the second direction from the ends of the first lines and second patterns formed on sidewalls of the first patterns.

4. The semiconductor device of claim 3, wherein the first pattern and the second pattern have generally the same width.

5. The semiconductor device of claim 3, wherein the first pattern and the second pattern have an identical width.

6. The semiconductor device of claim 1, wherein the dummy patterns are extended generally in the second direction generally between the second lines.

7. The semiconductor device of claim 1, wherein the dummy patterns are irregularly disposed between the second lines.

8. The semiconductor device of claim 1, further comprising a line group including four second lines; and the dummy patterns being disposed outside the line group, before a first outer line of the line group and after a last outer line of the line group.

9. The semiconductor device of claim 1, wherein:
the first lines are arranged at first intervals, and
the second lines are arranged at second intervals.

10. The semiconductor device of claim 8, wherein:
the first intervals are arranged at identical intervals, and
the second intervals are arranged at irregular intervals.

11. The semiconductor device of claim 1, wherein:
an interval between the second lines is generally the same as an interval between the first lines, and
an interval between the second lines in areas where the dummy patterns are disposed is wider than the interval between the first lines.

12. The semiconductor device of claim 1, further comprising:
a drain select line and a source select line each having a wider width than each of the conductive lines,
wherein the first lines of the conductive lines are disposed between the drain select line and the source select line.

13. The semiconductor device of claim 1, wherein the dummy patterns are not disposed between the first lines.

* * * * *